US012750062B1

(12) United States Patent
Anvari

(10) Patent No.: US 12,750,062 B1
(45) Date of Patent: *Sep. 29, 2026

(54) SIMPLE SELF-DISCIPLINED OSCILLATOR

(71) Applicant: Kiomars Anvari, Walnut Creek, CA (US)

(72) Inventor: Kiomars Anvari, Walnut Creek, CA (US)

(73) Assignee: Kiomars Anvari, Walnut Creek, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/357,233

(22) Filed: Oct. 14, 2025

Related U.S. Application Data

(63) Continuation-in-part of application No. 19/197,531, filed on May 2, 2025, now Pat. No. 12,461,248.

(51) Int. Cl.
*H03L 7/187* (2006.01)
*H03L 7/099* (2006.01)

(52) U.S. Cl.
CPC ............ *H03L 7/187* (2013.01); *H03L 7/0992* (2013.01)

(58) Field of Classification Search
CPC ....................................................... H03L 7/187
USPC ........................................................... 331/16
See application file for complete search history.

(56) References Cited

U.S. PATENT DOCUMENTS

| | | | | |
|---|---|---|---|---|
| 5,861,842 | A * | 1/1999 | Hitch | G04G 7/02 455/13.2 |
| 12,320,903 | B2 * | 6/2025 | Sohn | G01S 19/215 |
| 12,461,248 | B1 * | 11/2025 | Anvari | G01S 19/215 |
| 2008/0198070 | A1 * | 8/2008 | Wang | H03J 7/04 342/357.62 |
| 2017/0163409 | A1 * | 6/2017 | Hongou | H03L 7/113 |
| 2022/0209880 | A1 * | 6/2022 | Sarda | H04J 3/0605 |

* cited by examiner

*Primary Examiner* — Joseph Chang

(57) ABSTRACT

A simple, and low-cost oscillator solution that uses a self-disciplined circuit to maintain its frequency with high accuracy. The self-disciplined circuit includes a counter and a constant delay circuit. The oscillator is used to increment the counter. The constant delay circuit records the value of the counter when triggers a delay block with a trigger signal and when the trigger signal is detected at the output of the delay block. The difference between the two counter values is used to calculate a time drift and to maintain the frequency of the oscillator at the desired value.

19 Claims, 15 Drawing Sheets

250

100

200

225

250 time drift = t2 - ( t1 + D ) or time drift = t2 - ( t1 + N * D )

t2 D t1

$$\text{time drift} = t2 - (t1 + D) \quad \text{or}$$

$$\text{time drift} = t2 - (t1 + N * D)$$

300

400

500

Simple self-adjusting oscillator

SIMPLE SELF-DISCIPLINED OSCILLATOR

The application claims priority to the following related applications and included here are as a reference.

Application: U.S. patent application Ser. No. 19/197,531 filed May 2, 2025.

Application: U.S. patent application No. 63/642,895 filed May 6, 2024.

BACKGROUND

Synchronization (sync) and timing are essential to telecommunications networks to ensure optimal performance and prevent packet loss, dropped frames and degradation of quality of experience that will affect end-user services. Most critical telecom applications require precise time and frequency synchronization to operate properly. In traditional digital telecommunications networks, sync was maintained by employing two types of synchronization elements, Primary Reference Clocks (PRC) and distribution Clocks, over a physical circuit. The PRC (using either Cesium or GPS) provides a reference signal for the synchronization of other clocks within a network, or section of a network. Distribution clocks select one of the external synchronization links coming into a station as the active synchronization reference. These two types of clocks attenuate jitter and wander, maintain operation in holdover mode, and provide synchronization outputs to all network elements.

In packet-based networks, choosing a sync technology becomes more challenging, because packet-based networks do not deliver synchronization naturally as the traditional network elements did. Therefore, synchronization must be engineered into the packet backhaul and fronthaul. Precise synchronization is especially critical in mobile networks for the successful call signal handoff and proper transmission between base stations, as well as for the transport of real-time services. If individual base stations drift outside the specified frequencies, mobile handoff performance decays, calls interfere, and calls cannot be made, resulting in high dropped-call rates, impaired data services, and, ultimately, lost customers.

Wireless networks have further exacerbated the potential impact, to a point where governments, major telecom/mobile operators, and enterprises are now urgently looking for a way to protect their networks against both regional GNSS (global navigation satellite system) issues as well as the potential for a massive global GNSS outage.

Anti-jamming and anti-spoofing solutions can play a part in the protection of GNSS against jamming and spoofing threats that may be encountered in a telecom or mobile network. However, driven by industry standards for primary references, there is a better approach that not only protects the network but also provides a level of performance that has not been previously achieved. If timing or synchronization reference is temporarily lost, a network's ability to maintain time or "holdover" becomes critical to ensure optimal network performance.

Holdovers are critical to ensure service continuity as well as keeping the operator's OPEX to a minimum. In certain geographical areas where GPS signals are received only intermittently, holdover is crucial for the operation of base stations. Holdover technologies are also necessary to maintain sync during GPS outages caused by external events. Criminals can also jam GPS signals locally, given the commercial availability of GPS jammers, and environmental factors such as sunspots also contribute to GPS disruptions. Out-of-sync base stations dramatically increase the operator's OPEX. Further, if telecommunications regulations such as E911 requirements are violated, the operator may incur additional expenses of reporting outages and carrying out audits. Synchronization standards have defined the term "holdover" so that the network continues to function reliably in the event the synchronization input is disrupted or temporarily unavailable. These requirements specify the maximum allowed excursions of an output clock in the event an input is disrupted.

The Internet of Things (IoT) describes a worldwide network of intercommunicating devices. Internet of Things (IoT) has reached many different players and gained further recognition. Out of the potential Internet of Things application areas, Smart Cities (and regions), Smart Car and mobility, Smart Home and assisted living, Smart Industries, Public safety, Energy & Environmental Protection, Agriculture and Tourism as part of a future IoT Ecosystem have acquired high attention.

Wireless IoT networks are composed of autonomous sensor nodes that are spatially distributed to monitor physical or environmental conditions and share their data through the network via wireless communications. One of the key elements in most of the main applications developed on IoT is time synchronization. Time synchronization, or the way an IoT device adjusts its internal clock to align with the clocks of other devices in the network is crucial because of wireless communications. An adequate time-synchronization strategy allows the network to achieve reliable, energy-efficient, and low-latency communication. Another reason to consider time synchronization a vital characteristic in IoT networks is that a coordination of events in different nodes is possible with it. Therefore, information from different nodes can be merged to obtain a complete picture of the scenario under monitoring. Synchronization is also at the center of many of today's IoT challenges, particularly for low-power IoT networks and end devices.

Synchronizing an IoT network is not a trivial task. Clocks drift out of synchronization, especially those using low cost, commodity computing parts that are often used in low power IoT. Since each of the devices in the network has its own clock, a synchronization strategy is needed to make them all work in unison. The most common strategy consists in synchronizing all the devices' clocks with a reference clock. In most cases it is not enough to synchronize local clocks once at the beginning of the application because, usually, local clocks in the wireless devices are not stable enough to keep the synchronization in the network during the lifetime of the application. In most cases, more advanced synchronization strategies are needed to keep the application properly synchronized during its whole operation.

This application discloses a simple, and low-cost oscillator solution that uses a self-disciplined circuit to maintain its frequency with high accuracy. The self-disciplined circuit includes a counter and a constant delay circuit. The oscillator is used to increment the counter. The delay circuit reads the value of the counter when triggers the delay with a signal and when the trigger signal is detected at the output of delay component. The difference between the two counter values is used to maintain the frequency of the oscillator at the desired value.

The drawings referred to in this description should be understood as not being drawn to scale except if specifically noted.

DESCRIPTION OF EMBODIMENTS

Reference will now be made in detail to embodiments of the present technology, examples of which are illustrated in the accompanying drawings. While the technology will be described in conjunction with various embodiments, it will be understood that they are not intended to limit the present technology to these embodiments. On the contrary, the present technology is intended to cover alternatives, modifications, and equivalents, which may be included within the spirit and scope of the various embodiments as defined by the appended claims.

Furthermore, in the following description of embodiments, numerous specific details are set forth to provide a thorough understanding of the present technology. However, the present technology may be practiced without these specific details. In other instances, well-known methods, procedures, components, and circuits have not been described in detail as not to unnecessarily obscure aspects of the present embodiments.

A key target for Quartz Frequency Standards is Accuracy, Stability and Precision. Precision is about putting all the bullets through the same spot on the target, not necessarily the bulls-eye—with precision, results are repeatable.

Accuracy is about hitting the center of the target—the results are centered on the bullseye.

Stability is about getting the same results yesterday, tomorrow, day and night, so that at any time it is known what to expect-every target has holes in the same place.

The same applies to oscillators. A precise oscillator gives the same measurement every time. An accurate oscillator is on the expected frequency. A stable oscillator changes very little day to day. Although using GPS to discipline oscillators has been developed for decades, the solutions still are either expensive or still have performance limitations. This application discloses a solution for self-disciplined oscillator (SDO) with an adaptive drift correction algorithm, which is very low cost and suitable for Internet of Things (IoT) devices or any low-cost applications.

Figure 1:
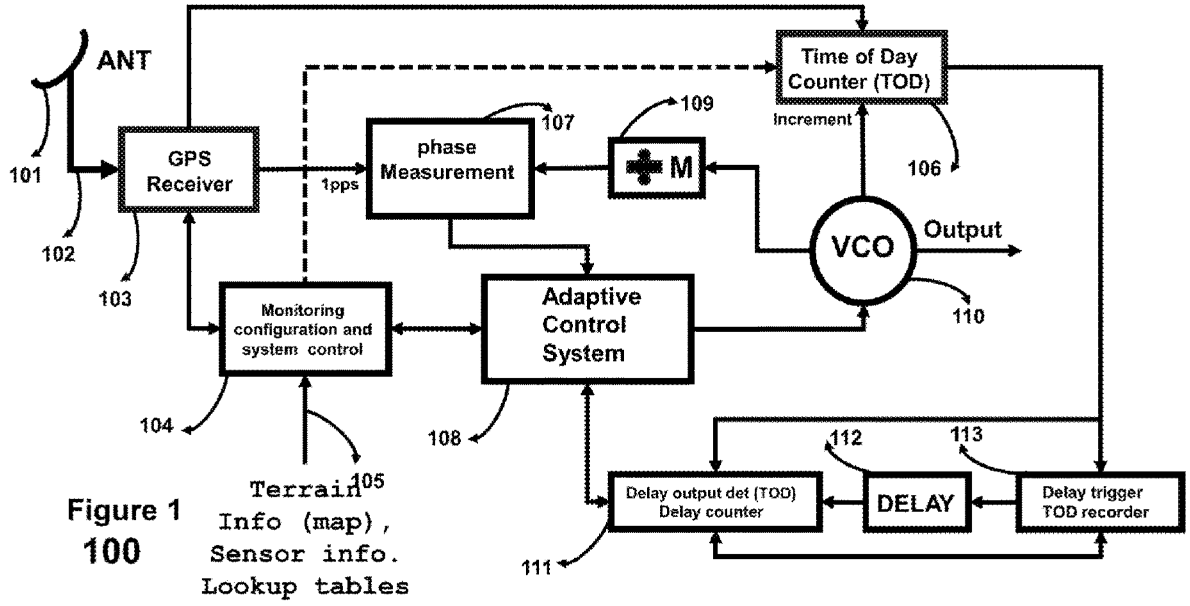
FIG. 1 illustrates block diagram of a self-disciplined oscillator using GPS and all-silicon delay line.

FIG. 1 illustrates block diagram of a SDO 100. In this solution GPS receiver 103 receives the GPS signal through antenna 101 and antenna cable 102 and retrieves time of day (TOD) and 1 PPS (pulse per second). TOD is used to update the TOD counter 106 and 1 PPS is sent to phase measurement 107. GPS receiver 103 also communicates with monitoring, configuration, and system control (MCSC) 104 that configures GPS receiver 103, detects loss of GPS signal and any glitches in 1 PPS, uses terrain, Lookup tables, and sensors information data to assist adaptive control system 108, and manage TOD counter 106. Lookup tables contain the behavior of the circuits (like oscillator 110 and the delay block 112, and others) with regards to environmental (temperature, humidity, and others) variation.

Phase measurement 107 uses 1 PPS and voltage control oscillator (VCO) 110 output directly or when is divided by "M" through divider 109 to measure the time difference between the 1 PPS pulse and the output of divider 109 which is essentially a phase measurement. Phase measurement 107 output is fed to adaptive control system (ACS) 108. ACS 108 calculates the error voltage and applies it to VCO 110 to adjust its output frequency and phase. VCO 110 is used for incrementing the time of day (TOD) counter 106. The output frequency of VCO directly increments counter 106 or output frequency of VCO is scaled down (divide by N, down converted) or up (multiply by N, up converted) before being used to increment counter 106.

Figure 2A:
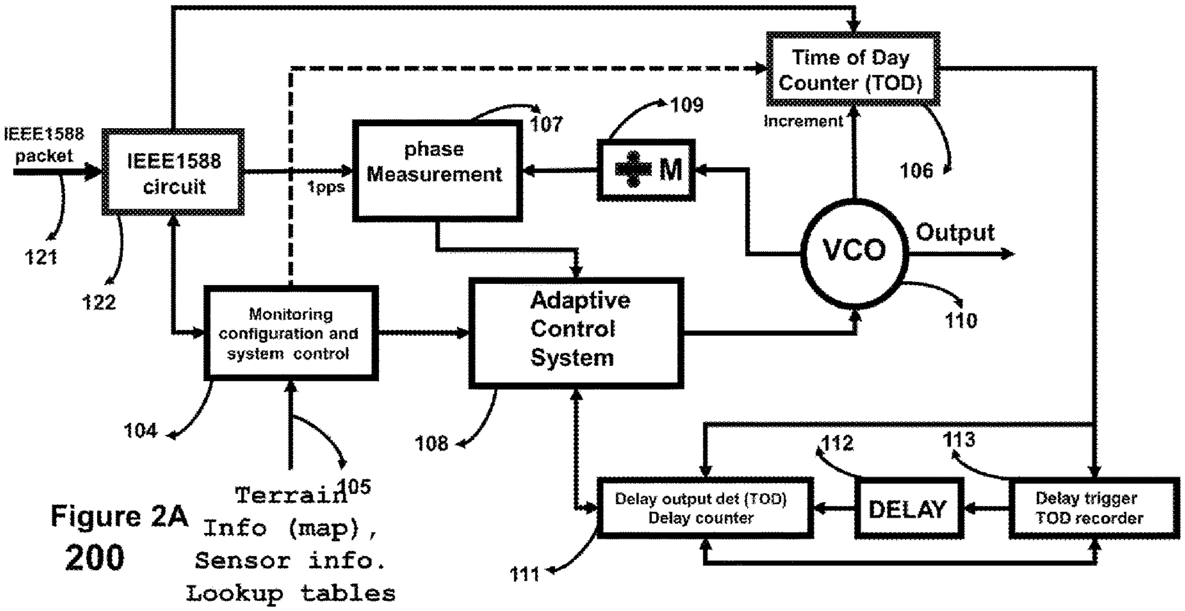
FIG. 2A depicts block diagram of a self-disciplined oscillator using IEEE1588 and all-silicon delay line.

FIG. 2A shows the block diagram of SDO 200. SDO 200 functions like SDO 100 but instead of GPS receiver uses IEEE1588 (institute of electrical and electronic engineers) precision time protocol (PTP). The IEEE1588 PTP circuit 122 communicates with another node in wireline or wireless network that has IEEE1588 PTP capability and can exchange IEEE1588 PTP packets 121. IEEE1588 PTP circuit 122 by exchanging IEEE1588 PTP packets with any wireless or wireline node obtains time of day (TOD) and clock synchronization to produce 1 PPS signal for phase measurement 107.

When GPS is not available (jammed, spoofed, GPS signal is lost or interrupted due to terrain or movement of an object using the oscillator), and IEEE1588 PTP packets are lost, low-cost oscillator 110 loses its accuracy, precision, and stability in a very short time. To overcome loss of TOD and 1 PPS, low-cost oscillator 110 needs to be self-disciplined. Monitoring, configuration, and system control 104 detects the loss of GPS signal from GPS receiver 103 and loss of IEEE1588 PTP packet 121 from IEEE1588 PTP circuit 122. It also receives terrain (valleys, high rise buildings, mountainous areas, etc.) and sensors information data 105. MCSC 104 when detecting loss of 1 PPS or possible loss of 1 PPS due to the terrain it sends a command to adaptive control system ACS 108 to hold the last error voltage used to adjust VCO 110 and activate self-disciplined circuit immediately. It also stops the time-of-day counter 106 to be updated by GPS receiver 103 or IEEE1588 PTP circuit 122.

Self-disciplined circuit comprises of delay 112, delay trigger 113, and delay output detection 111. When ACS 108 activates self-disciplined circuit, delay detection 111 activates the delay trigger 113 to apply delay trigger to delay 112. Delay trigger 113 also record time of day "t1" obtained from TOD counter 106 indicating when delay 112 is triggered. Delay detection 111 detects when delay "D" is completed from the output of delay 112. Once the output of the delay 112 is detected delay output detection 111 records time of day "t2" obtained from TOD counter 106. If the VCO 110 is not drifted, then.

$$t2 = t1 + D$$

If the VCO 110 is drifted "t2" is not equal to t1+D and time drift=t2−(t1+D) which can be positive or negative. Time drift is sent to ACS 108 to modify the error voltage that is applied to VCO 110 as well as adjusting the time of day (TOD) counter 106 through MCSC 104 or directly. Time drift can also directly from delay output detector 111 sent to MCSC 104. ACS 108 uses an artificial intelligent adaptive algorithm that uses the time drift calculated by self-disciplined circuits as well as information data it receives from various sensors and look up tables through MCSC 104 to adjust the error voltage that is applied to VCO 110 for adjustment of its frequency and phase.

Delay output detection 111 can also send trigger signal to delay trigger 113 immediately after it detects the output of the delay 112 and increments a counter to record the number of times delay 112 is triggered. The number of consecutive triggering of delay 112 is defined by ACS 108. If "t1" is time of day when first time delay 112 is triggered and "t2" is the detection time of day when last time output of delay 112 is detected (after "N" consecutive delay), then if "t2" is equal to t1+N*D, VCO 110 is not drifted. If "t2" is not equal to t1+N*D, then time drift is $$\text{time drift} = t2 - (t1 + N * D)$$

This time drift is sent to ACS 108 to be used by artificial intelligent adaptive algorithm to calculate the error voltage for VCO 110.

Figure 2B:
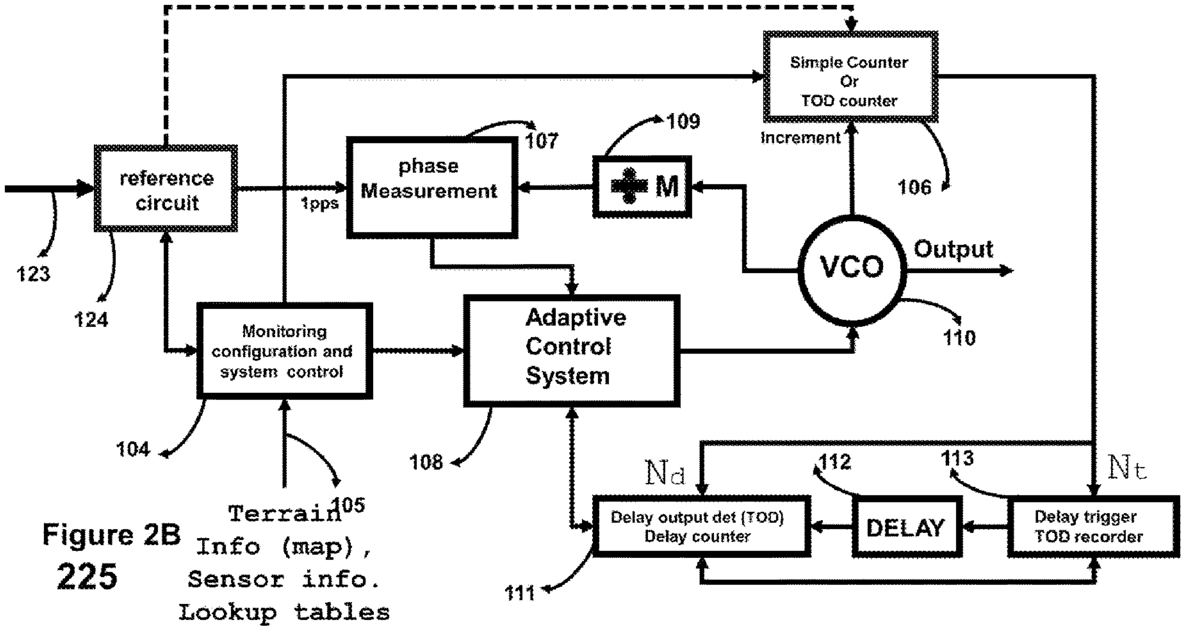
FIG. 2B depicts the block diagram of a self-disciplined oscillator using a reference different from GPS or its derivatives and all-silicon delay line.

FIG. 2B shows the block diagram of SDO 225. SDO 225 functions like SDO 100/200 but instead of GPS receiver or IEEE1588 precision time protocol (PTP) uses a proprietary/standard reference. The proprietary/standard reference 123 is a stable clock provided by another source directly, through wireline using any standard/proprietary serial/parallel protocol, through wireless link using any standard/proprietary over the air protocol, back plane, an external device/source using USB, and an external device/source through a serial/parallel port. The proprietary/standard reference 123 is defined by various standard organizations (International Telecommunication Union, Institute of Electrical and Electronics Engineers, Federal Communications Commission, WiFi alliance, Cellular Telephone Industries Association, etc.), and any other standard organizations. The source or organization that provides reference 123 can be a public or private company, one of the standard organizations mentioned above or any new standard institution.

The proprietary/standard reference 123 can also provide time of day (TOD) to be used by counter 106 that is incremented by VCO 110. In this scenario reference circuit 124 retrieves the TOD (through time stamps or other technologies) from proprietary/standard reference 123 and use it to adjust counter 106 (acting as time of day) when needed. Reference circuit 124 also retrieves 1 PPS (or a PPS that has a width higher or lower than one second) from proprietary/standard reference 123 and sends it to phase measurement 107. When proprietary/standard reference 123 does not provide TOD, then VCO 110 only increments the counter 106 (acting as simple number counter). In this case counter 106 provides delay trigger 113 and delay output detector 111 the value of counter 106 (N). The difference between the value of counter 106 when trigger happens in 113 (Nt) and when output is detected by 111 (Nd) is used to determine the time drift as shown below.

$$\text{Time drift} = D - (Nd - Nt) / Fo$$

Where Fo is the wanted frequency of VCO.

Figure 2C:
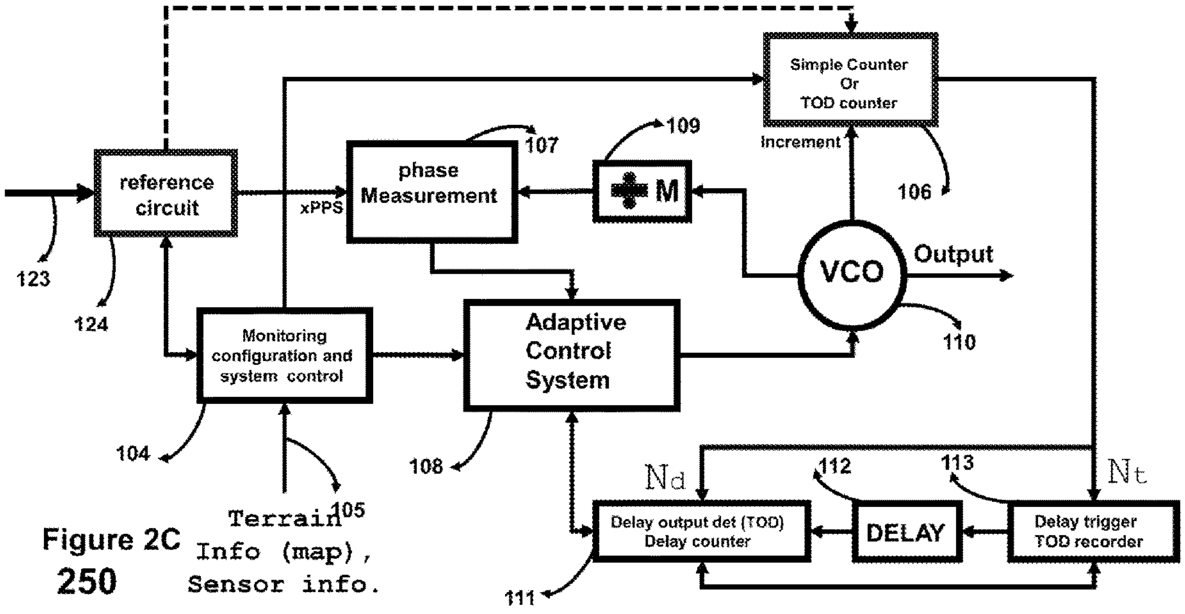
FIG. 2C depicts the block diagram of a basic self-disciplined oscillator with hold over.

FIG. 2C shows the block diagram of SDO 250. SDO 250 functions like SDO 225 but the signal it provides for phase measurement 107 is xPPS, where "x" can be 1, less than 1, or more than 1. The value of "x" is provided to reference circuit 124 by monitoring configuration and system control 104.

Figure 3:
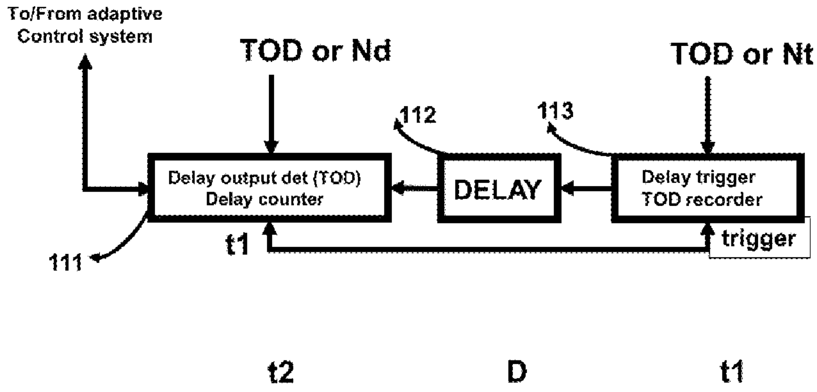
FIG. 3 shows block diagram of a self-disciplined circuit using all-silicon delay line.

FIG. 3 shows the details of self-disciplined process. Time of day counter is adjusted by the time drift. Time drift is sent to TOD counter 106 from MCSC 104. MCSC obtains the time error from ACS 108 or directly from delay output detector 111. TOD counter can be updated by ASC 108, delay output detector 111, or MCSC 104.

The process of calculating a time drift is repeated until GPS, IEEE1588 or proprietary/standard reference is restored, and the time-of-day counter can be updated, and ASC 108 uses the output of phase measurement 107 again.

Figure 4:
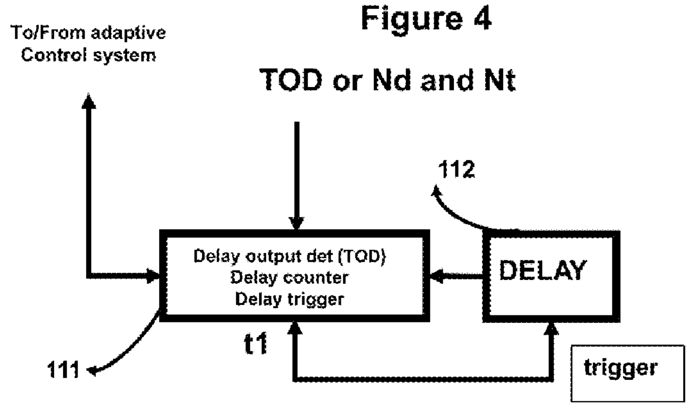
FIG. 4 illustrates block diagram of self-disciplined circuit using all-silicon delay line with delay trigger circuit and delay output detector combined.

FIG. 4 depicts a self-disciplined circuit that delay output detection 111 also performs the triggering function. Delay output detection 111 at time of day (TOD) "t1" triggers delay 112 and at time of day (TOD) "t2" detects output of delay 112. Then calculate the time drift "t2"−("t1"+D) for intelligent adaptive algorithm in ACS 108 to update the error voltage applied to the VCO 110. Delay output detection 111 also instead of triggering once can trigger delay 112 "N" consecutive times. In this case the time drift is $$\text{time drift} = \text{"}t2\text{"} - (\text{"}t1\text{"} + N * D)$$

The number of consecutive delay triggering is defined by ACS 108. ASC 108 uses the time drift to adjust the error voltage for VCO 110. Time of day counter is also adjusted by the time drift. Time drift is sent to TOD counter 106 from MCSC 104, ASC 108, or delay output detector 111. MCSC obtains the time drift from ACS 108 or directly from delay output detector 111.

The process of calculating a time drift is repeated until GPS, IEEE1588 or proprietary/standard reference is restored, and the time-of-day counter (or simple number counter) can be updated, and ASC 108 uses the output of phase measurement 107 again.

Electrical delay lines can generate time delays from a few nanoseconds to several microseconds, which can be implemented based on long electrical lines, discrete inductors and capacitors, integrated circuit storage, bulk acoustic wave (BAW), surface acoustic wave (SAW), electromagnetic bandgap (EBG) elements, integrated circuit (IC) components, etc.

The delay circuit in this solution can be based on an off-the-shelf all-silicon delay line of products on the market. The basic building block of a silicon delay line consists of a ramp generator with associated logic. The input signal triggers a ramp generator that supplies a laser-adjusted voltage-to-time relationship. A comparator is used to detect the ramp reaching the reference voltage, this set or resets the output latch.

The example below clarifies the function of self-disciplined oscillator. We assume that, a) Delay 112=1 microsecond
b) Number of consecutive triggering "N"=10000000
c) The clock used by ACS 108 and self-disciplined circuits 111, 112 and 113=500 MHz
d) The number of clocks used for delay output detector 111 and delay triggering 113=5 clock cycles
e) Oscillator frequency offset is 10 PPM (part per million) =10E-6

Total delay due to delay 112=1 (microsecond)×10,000,000=10 second

Clock cycle=2 nanosecond

Delay output detection and triggering=2 (nanosecond)×5×10.000,000=100 millisecond=0.1 second Total delay=10.1 second Time drift=oscillator frequency offset×total delay Time drift=10E-6×10.1=10.1 E-5 second=101 microsecond This indicates that the time-of-day TOD is drifted 101 microseconds for 10.1 second that VCO 110 was running. Therefore, the TOD counter 106 needs to be adjusted and the VCO frequency that caused the time drift needs to be adjusted too. The number of triggering delay 112 "N" is specified by ACS 108 and depends on the information data ACS 108 receives from various sensors, deep learning of the VCO 110 behavior, delay block behavior, and accuracy requirement for VCO 110. MCSC 104 provides sensors data, look up table data, and various parameters that are mentioned in later paragraphs.

During the time that reference signal with or without time of day is used to discipline the VCO 110 the self-discipline circuit can stay active without being used by ACS 108 to collect data related to behavior of the delay block. The collected data indicates any changes regarding temperature, humidity, and aging characteristics of the delay block. The collected data as well as the look up table data related to delay block provided by configuration MCSC 104 are used by ACS 108 artificial intelligent adaptive algorithm during the time that the reference signal is not available and self-discipline circuit is used to discipline the VCO 110.

During the time that reference signal with or without time of day is used to discipline VCO 110 the self-discipline circuit can stay active and be used for fine tuning the oscillator. Therefore, reference signals are used for coarse tuning and self-discipline circuit is used for fine tuning.

Figure 5A:
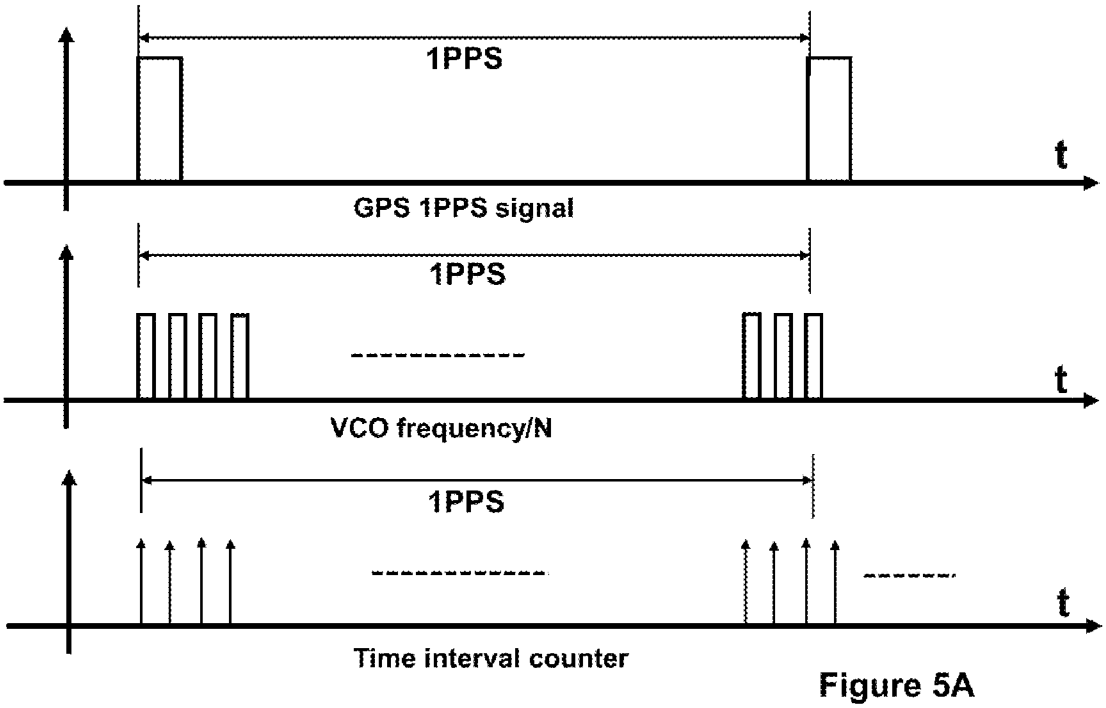
FIG. 5A depicts phase measurement block signals.

The phase measurement circuit 107 uses a frequency counter with high enough accuracy. Measuring frequency directly by counting pulses is very simple and at a low cost, but it provides a fixed absolute resolution, meaning the precision depends on the frequency of the signal for a given measurement gate. FIG. 5A shows a frequency counting for a single 1 PPS time gate. The slower the frequency of the signal is, the longer the measurement gate needs to be to achieve the same precision. By increasing the frequency of the signal applied to phase measurement circuit 107 supplied by VCO 110 and divider "M" 109 the precision increases. The alternative is to use multiple 1 PPS time gate for counting to increase the precision.

Figure 5B:
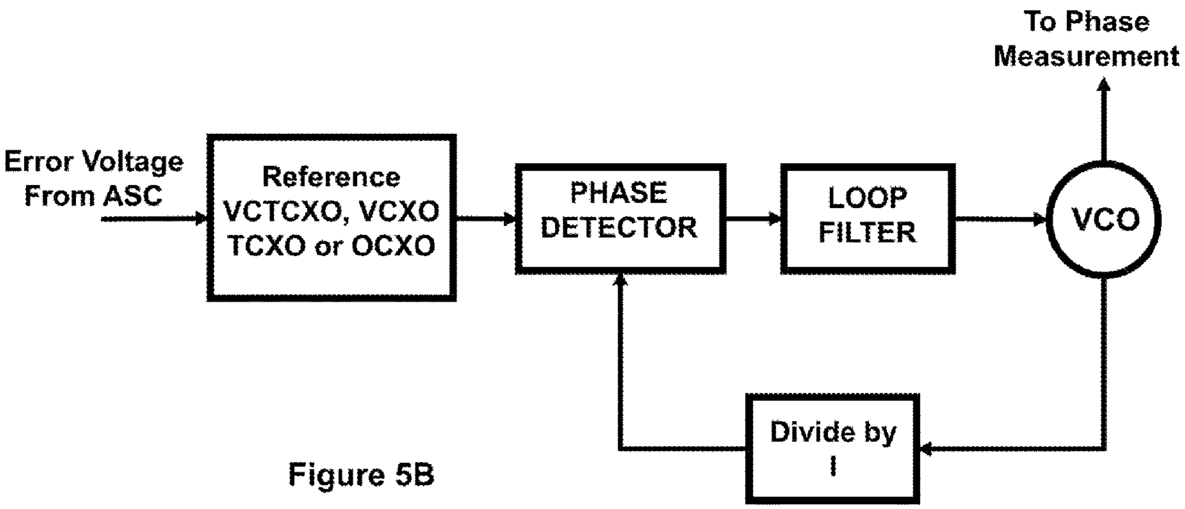
FIG. 5B shows VCO controlled by a reference VCTCXO, VCXO, TCXO or OCXO.

The VCO can be just a simple oscillator, or a phase locked loop (PLL) oscillator as shown in FIG. 5B. The PLL oscillator uses a voltage control temperature compensated crystal oscillator (VCTCXO), a temperature compensated crystal oscillator (TCXO), a voltage control crystal oscillator (VCXO) or an oven control crystal oscillator (OCXO) as a reference source. The output of the oscillator that is phased locked by the reference oscillator is used to supply the signal for phase measurement 107. The error voltage from the ASC is applied to VCTCXO, TCXO, VCXO, or OCXO to compensate for their drifts due to various environmental parameters or aging. The oscillator can also be simply a VCTCXO, VCXO or OCXO and self-disciplined circuits will be used to improve their accuracy, precision, stability, and holdover.

Figure 6:
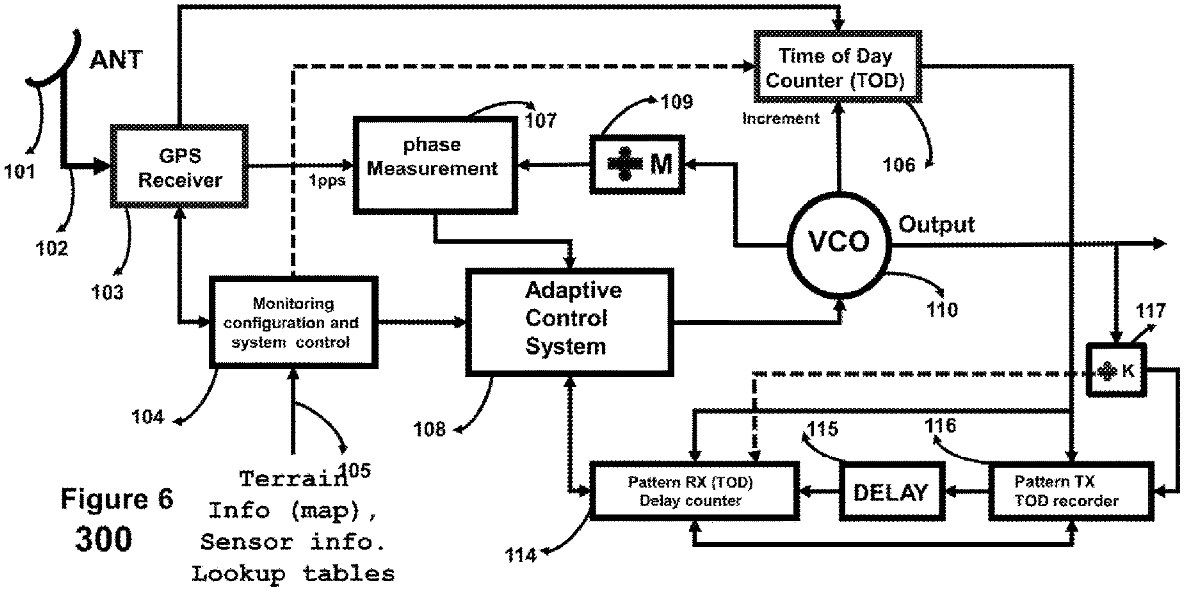
FIG. 6 illustrates block diagram of a self-disciplined oscillator using GPS/IEEE1588 and SAW delay line.

FIG. 6 shows block diagram of the SDO 300. All components of the SDO 300 are the same as SDO 100 except the self-disciplined circuit that uses an intermediate frequency (IF) delay 115. One of the delay lines that produces high delays uses surface acoustic wave (SAW). SAWs are acoustic waves traveling along the surface of a material exhibiting elasticity. The amplitude of an acoustic wave typically decays exponentially with depth into the substrate. SAW devices can be easily generated on piezoelectric substrates by using interdigital transducers (IDTs).

A linear phase delay line has been achieved in an SAW element with a center frequency of 380 MHz, a bandwidth of 190 MHz, an insertion attenuation of 25 dB, and a time delay of 750 ns. Also, a delay line with a linear group delay can be achieved by using a chirped reflector or transducer. For example, a linear group delay response with a slope of 0.4 μs/MHz has been achieved by using a chirped SAW delay line.

Commercial SAW bandpass filters are extensively used in wireless communication receivers and transmitters. The self-disciplined circuit of SDO 300 uses an IF SAW filter. By using a lower bandwidth IF SAW filter higher time delays can be achieved, Low-cost sub microsecond time delays at IF frequencies are readily available or can be customed build. Intermediate frequencies (IF) can vary from 50 MHz to GHz depending on application.

Figure 7:
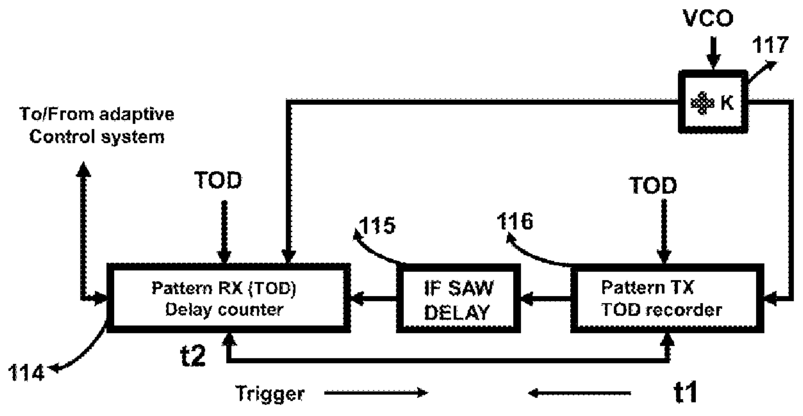
FIG. 7 depicts block diagram of self-disciplined circuit using SAW delay.

In FIG. 6 the self-disciplined circuit uses VCO 110 to obtain a suitable and practical "IF" frequency. As shown in FIG. 7 the VCO 110 frequency is divided by "K" to a lower "IF" frequency in divider 117 to be used both for the transmitter (TX) 116 and receiver (RX) 114. The delay is provided by a surface acoustic wave (SAW) filter 115. A pattern that is known to both pattern transmitter (TX) 116 and pattern receiver (RX) 114 is modulated to the "IF" frequency in pattern TX 116 using a simple modulation like BPSK or any other modulation technique and the modulated "IF" sent to the pattern RX 114 through delay 115 which is a SAW bandpass filter. Pattern TX 116 also record the time-of-day "t1" that the last symbol or bit of the pattern is sent and share "t1" with pattern RX 114. The pattern RX 114 after a "D" delay receives the transmitted pattern and demodulate the transmitted pattern with the same "IF" frequency from divider 117. Pattern RX record time of day "t2" when the last symbol or bit of the pattern is received. If t2=t1+D then there is no drift in VCO 110 frequency. If not, then time drift=t2−(t1+D). It is also possible to send the pattern "N" times though the delay 115. Each time pattern RX 114 detects the last symbol or bit of the pattern, then send a trigger to pattern TX to send the pattern and this repeats "N" times. When pattern TX 116 sends the last pattern the pattern RX records time "t2" when the last symbol or bit of the pattern is detected. Then time drift=t2−(t1+N.D). This time drift is sent to ASC 108 to adjust the VCO 110 and to time-of-day counter 106 to adjust the TOD. The "N" is determined by ASC 108 and sends to pattern RX 114 that shares with pattern TX 116. Pattern RX 114 uses a counter to be incremented until the last pattern is received. The process of calculating a time drift is repeated until GPS or IEEE1588 is restored, and the time-of-day counter can be updated using GPS or IEEE1588 PTP and ASC 108 uses the output of phase measurement 107 again.

The delay of an electromagnetic signal is the ratio of the propagating length to the velocity. Therefore, by varying either or both parameters, the delay can be changed. A solution is to implement the delay lines using SiGe or Si based on the CMOS process. The implementation of a delay line in silicon can provide better compactness and more versatile architectural possibilities, with signal processing capabilities at little added cost and footprint.

Figure 8:
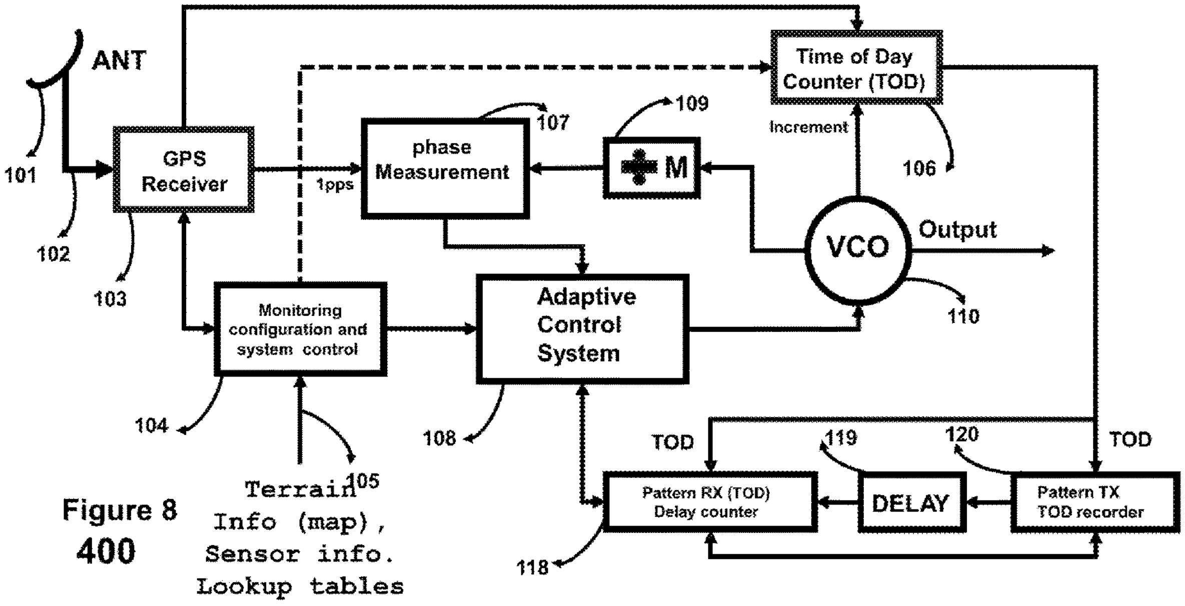
FIG. 8 shows block diagram of a self-disciplined oscillator using GPS/IEEE1588 and a delay line to delay baseband pattern.

FIG. 8 depicts SDO 400 using integrated circuit (IC) delay line explained above. SDO 400 functions like SDO 100, 200, 225, 250, and SDO 300. The only difference is self-disciplined circuit. SDO 400 in its self-disciplined circuit send a baseband pattern instead of a modulated patten (like SDO 300). When SDO 400 loses GPS or IEEE1588 PTP, to overcome loss of TOD and 1 PPS, low-cost oscillator 110 needs to be self-disciplined. Monitoring, configuration, and system control (MCSC) 104 detects the loss of GPS signal from GPS receiver 103 and/or loss of IEEE1588 PTP packets from IEEE1588 PTP as shown in FIG. 2A circuit 122. It also receives terrain (valleys, high rise buildings, mountainous areas, etc.), lookup tables, and sensors information data 105. MCSC 104 when detecting loss of 1 PPS or possible loss of 1 PPS due to the terrain it sends a command to adaptive control system ACS 108 to hold the last error voltage used to adjust VCO 110 and activate self-disciplined circuit immediately.

Figure 9:
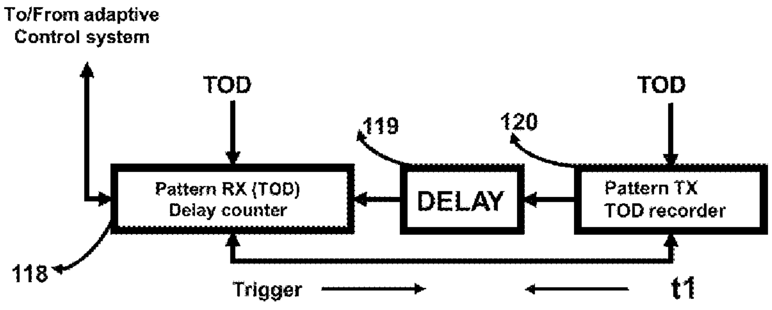
FIG. 9 illustrates block diagram of self-disciplined circuit using delay for baseband pattern.

A pattern that is known to both pattern transmitter (TX) 120 and pattern receiver (RX) 118 is sent to pattern RX 118 by pattern TX 120 through delay 119 as shown in detail in FIG. 9. Pattern TX also records the time-of-day "t1" that the last symbol or bit of the pattern is sent and share "t1" with pattern RX 118. The pattern RX 118 after a "D" delay receives the transmitted pattern and detects it. Pattern RX records time of day "t2" when the last symbol or bit of the pattern is received. The process of measuring time drift is like SDO 100, 200, 225, 250, and 300 explained in FIGS. 2B, 3, 4, and 7.

The process of calculating a time drift is repeated until GPS, IEEE1588 or proprietary/standard reference is restored, and the time-of-day counter can be updated using GPS, IEEE1588 PTP or proprietary/standard reference and ASC 108 use the output of phase measurement 107 again.

Figure 10:
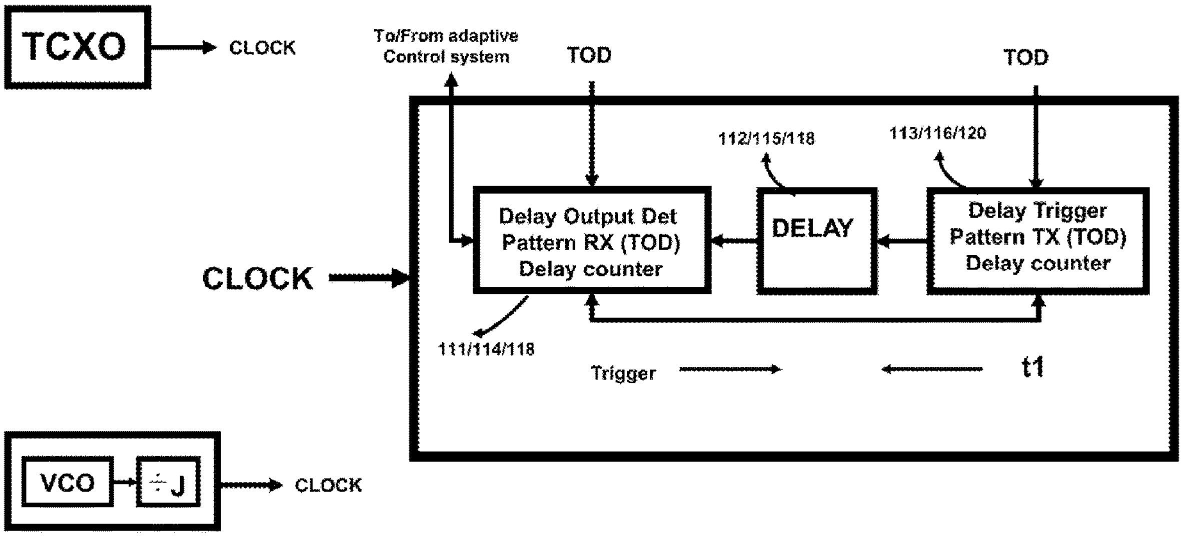
FIG. 10 depicts how the clock for self-disciplined circuit is provided.

FIG. 10 shows how the clock for self-disciplined circuit is provided. One way is to use a TCXO clock which is totally independent from clocks provided by VCO 110. A second way is to use a clock which is derived from VCO 110. Both VCO and TCXO clocks are used during the process of self-discipline. However, the number of clock cycles signal processing uses in circuits 111/114/118, and 113/116/119 is very small and their contribution to time drift is negligible. The main drift is due to delay 112/115/119 and the longer the delay the smaller the number of clock cycles used for signal processing.

The subject of this disclosure is the self-disciplined circuit, and the key component of this circuit is the delay 112/115/119. This delay component needs to be constant during time and variation in environmental parameters such as temperature and humidity. As explained earlier, delay 112/115/119 can be implemented using several technologies three of them 112/115/119 were used in this application. How the delay used in self-disciplined circuit is not the subject of this application. In other words, how the self-disciplined circuit is implemented is not subject of this application. There are numerous ways to implement self-disciplined circuits using a constant delay like 112/115/119. The main embodiment of delay 112/115/119 is that it is constant, and independent of any clock frequency. Other words it provides delay without using any clock frequency.

Figure 11:
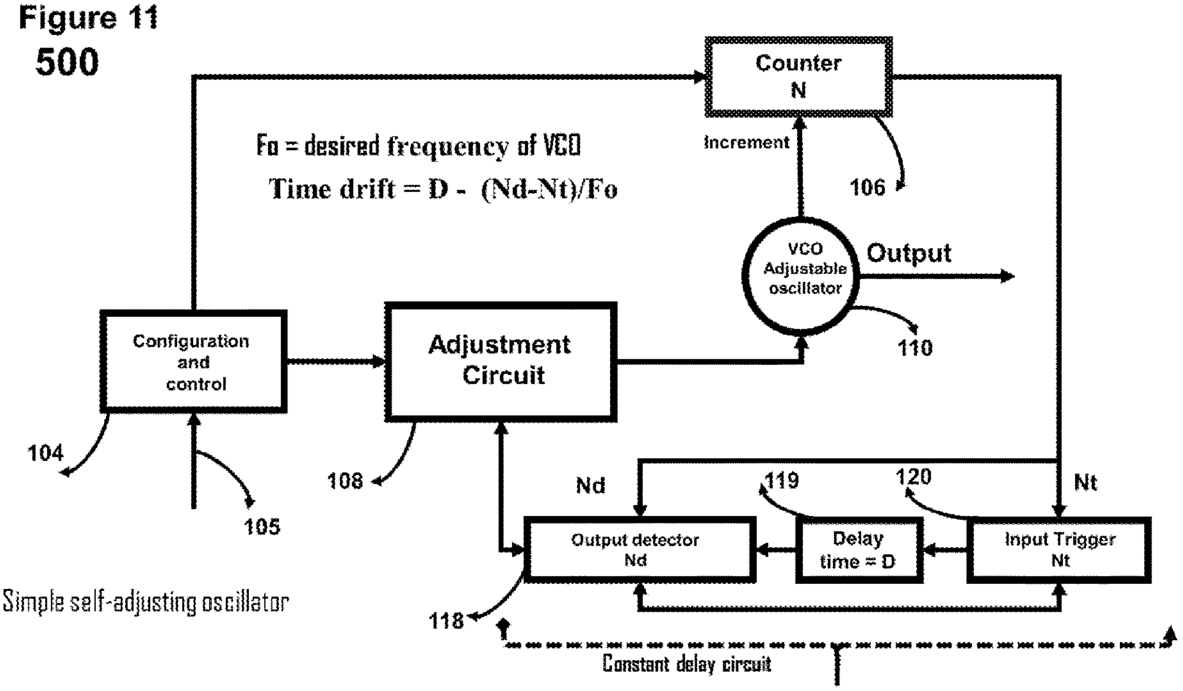
FIG. 11 shows a standalone oscillator with programmable stable output.

FIG. 11 depicts standalone oscillator (SO) 500. Standalone oscillator 500 operates like SDO 100 without a reference signal and time of day provided by GPS, IEEE1588 PTP, a standard organization or a company. The SO 500 is programed by configuration and control 104 through input 105 to configure operating parameters, an operating frequency, various thresholds, and lookup tables. Lookup tables contain the behavior of the adjustable oscillator 110 (VCO) and the delay block 119 with regards to environmental (temperature, humidity, aging, and others) variation. The SO 500 has an operating frequency range. Configuration and control (MCSC) 104 configure initial voltage for desired operating frequency (Fo) applied to VCO 110 (adjustable oscillator) and start the counter 106 from zero or an arbitrary number. VCO 110 increments counter (integer numbers) 106. VCO 110 (adjustable oscillator) may be scaled up or down before using to increment said counter. Configuration and control 104 also activate delay block 119 and its input 120 and output 118. The output frequency of VCO 110 is controlled as defined in FIG. 2B.

Daley block 119, its input 120 and output 118 constitute a constant delay circuit. The delay block 19 can be several delay blocks in series or in parallel (repeat triggering the delay block as shown in FIGS. 3 and 4). Depending on application and accuracy requirements the number of parallel (repeating) delay blocks is selected to provide the delay (D) of delay block 119 by ACS 108 (adjustment circuit). The delay block 119 is triggered by a trigger signal (an impulse, a pulse, or a pattern) and records the value of counter (Nt) 106 when the trigger signal is sent at its input 120. The output 118 detects the trigger signal at the output of delay block 119 and records the value of counter (Nd) 106 when the trigger signal is fully detected.

The adjustment circuit 108 (ACS) uses said Nt, Nd, and delay block 119 (D) to calculate time drift=D−(Nd−Nt)/Fo. Time drift is modified or adjusted by relevant information data from configuration and control (MCSC) 104 to calculate the adjustment voltage for the VCO 110 (adjustable oscillator). The relevant information data is various look-up tables, thresholds, and information from any automatic frequency control (AFC) adjustment provided by any circuit (e.g. receiver, equipment, device, etc.) using SO 500.

Configuration parameters and information include:

a) Look up table containing temperature behavior data of delay block 119, and VCO 110.

b) Look up table containing humidity behavior data of delay block 119 and VCO 110.

c) Look up table containing aging behavior data of delay block 119 and VCO 110.

d) type of delay block 119 and its input and output.

e) Bandwidth of delay block 119 and its input and output.

f) operating frequency of delay block 119 and its input and output.

g) Type of trigger signal for delay block 119 (a pulse, an impulse, and a pattern).

h) operating frequency for VCO 110 (adjustable oscillator) and an initial adjustment for VCO 110 (adjustable oscillator).

i) AFC adjustment value for VCO 110 (adjustable oscillator)

j) The number of delay blocks in parallel or repeat triggering the same delay block.

Figure 12A:
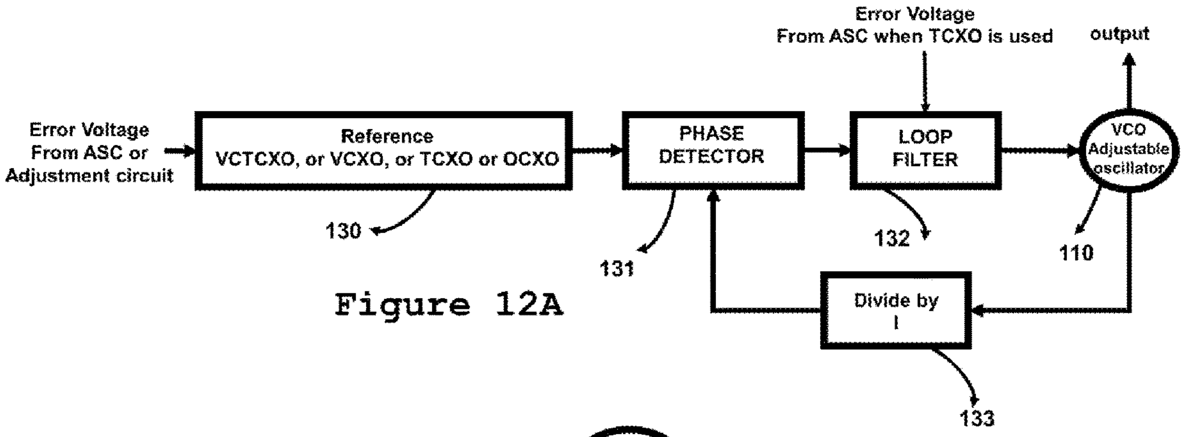
FIG. 12A depicts a phased locked loop oscillator.
Figure 12B:
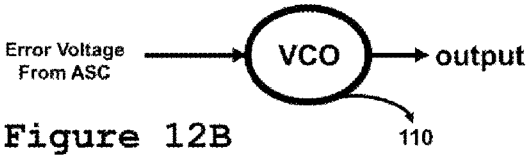
FIG. 12B shows a voltage control oscillator.

FIG. 12A shows VCO 110 is a phase lock loop with a reference block that is a VCTCXO (voltage control temperature control crystal oscillator), or a VCXO (voltage control crystal oscillator), or a TCXO (temperature control crystal oscillator), or an OCXO (oven control crystal oscillator), adjusted by adjustment circuit 108 or ACS 108. FIG. 12B depicts a standalone VCO 110 adjusted or controlled by adjustment circuit 108 or ACS 108.

Various embodiments are thus described. While embodiments have been described, it should be appreciated that the embodiments should not be construed as limited by such description but rather construed according to the following claims.

The invention claimed is:

1. A simple self-adjusting oscillator (SSO) comprising:

an adjustable oscillator;

a control circuit; and a desired operating frequency Fo;

said adjustable oscillator uses at least one of a voltage control oscillator (VCO), a voltage control crystal oscillator (VCXO), a voltage-controlled temperature compensated crystal oscillator (VC-TCXO), a temperature compensated crystal oscillator (TCXO), and an oven-controlled crystal oscillator (OCXO);

said control circuit consists of a counter that is incremented by said adjustable oscillator, an adjustment circuit, and a time delay circuit with a constant delay having a value D;

said time delay circuit sends a trigger signal to said constant delay and detects said trigger signal at the output of said constant delay;

said time delay circuit calculates a time drift of said adjustable oscillator by subtracting said value D from a difference of said counter's value Nd when said trigger signal is detected divided by said Fo and said counter's value Nt when said trigger signal is transmitted divided by said Fo which is said value D−(Nd−Nt)/Fo;

said time drift is used by said adjustment circuit to adjust said adjustable oscillator towards said Fo.

2. The SSO of claim 1, wherein said control circuit contains a configuration parameter.

3. The SSO of claim 2, wherein said time drift is modified by said adjustment circuit using said configuration parameter before adjusting said adjustable oscillator.

4. The SSO of claim 3, wherein said configuration parameter has a look up table containing information data of at least one of a temperature behavior of said constant delay, an aging behavior said constant delay, and a humidity behavior of said constant delay.

5. The SSO of claim 2, wherein said configuration parameter is a type of said constant delay.

6. The SSO of claim 2, wherein said configuration parameter is a bandwidth of said constant delay.

7. The SSO of claim 2, wherein said configuration parameter is an operating frequency of said constant delay.

8. The SSO of claim 2, wherein said configuration parameter is said trigger signal for said constant delay.

9. The SSO of claim 2, wherein said configuration parameter is said desired operating frequency for said adjustable oscillator.

10. The SSO of claim 2, wherein said configuration parameter is an accuracy requirement for said adjustable oscillator.

11. The SSO of claim 2, wherein said configuration parameter is an initial adjustment for said adjustable oscillator.

12. The SSO of claim 2, wherein said configuration parameter is an automatic frequency control (AFC) adjustment.

13. The SSO of claim 1, wherein said constant delay uses a delay block with said value D.

14. The SSO of claim 13, wherein said delay block delays said trigger signal.

15. The SSO of claim 13, wherein said constant delay is a plurality of said delay block in parallel or repeat triggering said delay block.

16. The SSO of claim 13, wherein said constant delay is a plurality of said delay block in series.

17. The SSO of claim 1, wherein said counter contains integer number.

18. The SSO of claim 1, wherein said adjustable oscillator is a phase lock loop circuit to produce said desired operating frequency Fo.

19. The SSO of claim 1, wherein said trigger signal is at least one of a pulse, an impulse, and a pattern.

* * * * *